(12) United States Patent
Schmitt et al.

(10) Patent No.: US 9,754,832 B2
(45) Date of Patent: Sep. 5, 2017

(54) SEMICONDUCTOR WAFER AND METHOD OF PRODUCING THE SAME

(75) Inventors: Florian Schmitt, Winsen I ILuhe (DE); Heimo Scheucher, Langegg (AT); Michael Ziesmann, Hamburg (DE)

(73) Assignee: NXP B.V., Eindhoven (NL)

( * ) Notice: Subject to any disclaimer, the term of this patent is extended or adjusted under 35 U.S.C. 154(b) by 424 days.

(21) Appl. No.: 13/473,712

(22) Filed: May 17, 2012

(65) Prior Publication Data

US 2012/0306056 A1 Dec. 6, 2012

(30) Foreign Application Priority Data

Jun. 3, 2011 (EP) ..................... 11168688

(51) Int. Cl.
| | |
|---|---|
| H01L 23/544 | (2006.01) |
| H01L 21/78 | (2006.01) |
| H01L 23/58 | (2006.01) |
| H01L 21/683 | (2006.01) |

(52) U.S. Cl.
CPC .......... *H01L 21/78* (2013.01); *H01L 21/6836* (2013.01); *H01L 23/585* (2013.01); *H01L 2221/6834* (2013.01); *H01L 2221/68327* (2013.01); *H01L 2221/68336* (2013.01); *H01L 2924/0002* (2013.01)

(58) Field of Classification Search
CPC ............................ H01L 21/78; H01L 21/6836
USPC .................. 257/620, E21.599; 438/462, 463
See application file for complete search history.

(56) References Cited

U.S. PATENT DOCUMENTS

| | | |
|---|---|---|
| 5,266,528 A | 11/1993 | Yamada |
| 6,372,610 B1 | 4/2002 | Chang et al. |
| 8,071,429 B1* | 12/2011 | Qian ................ H01L 21/78 257/E21.238 |
| 2007/0293020 A1* | 12/2007 | Pressel ............. B28D 5/0011 438/463 |
| 2009/0108410 A1 | 4/2009 | Takemura et al. |
| 2009/0111257 A1 | 4/2009 | Hsu et al. |
| 2009/0121321 A1 | 5/2009 | Miccoli et al. |
| 2010/0261335 A1* | 10/2010 | Andry ............... H01L 21/78 438/462 |
| 2012/0211748 A1* | 8/2012 | Miccoli ........... B23K 26/0057 257/52 |

OTHER PUBLICATIONS

European Search Report for European patent appln. No. 11168688.7 (Mar. 19, 2012).

* cited by examiner

*Primary Examiner* — Jamie C Niesz

(57) ABSTRACT

A semiconductor wafer (100) having a regular pattern of predetermined separation lanes (102) is provided, wherein the predetermined separation lanes (102) are configured in such a way that the semiconductor wafer is singularizable along the regular pattern.

19 Claims, 4 Drawing Sheets

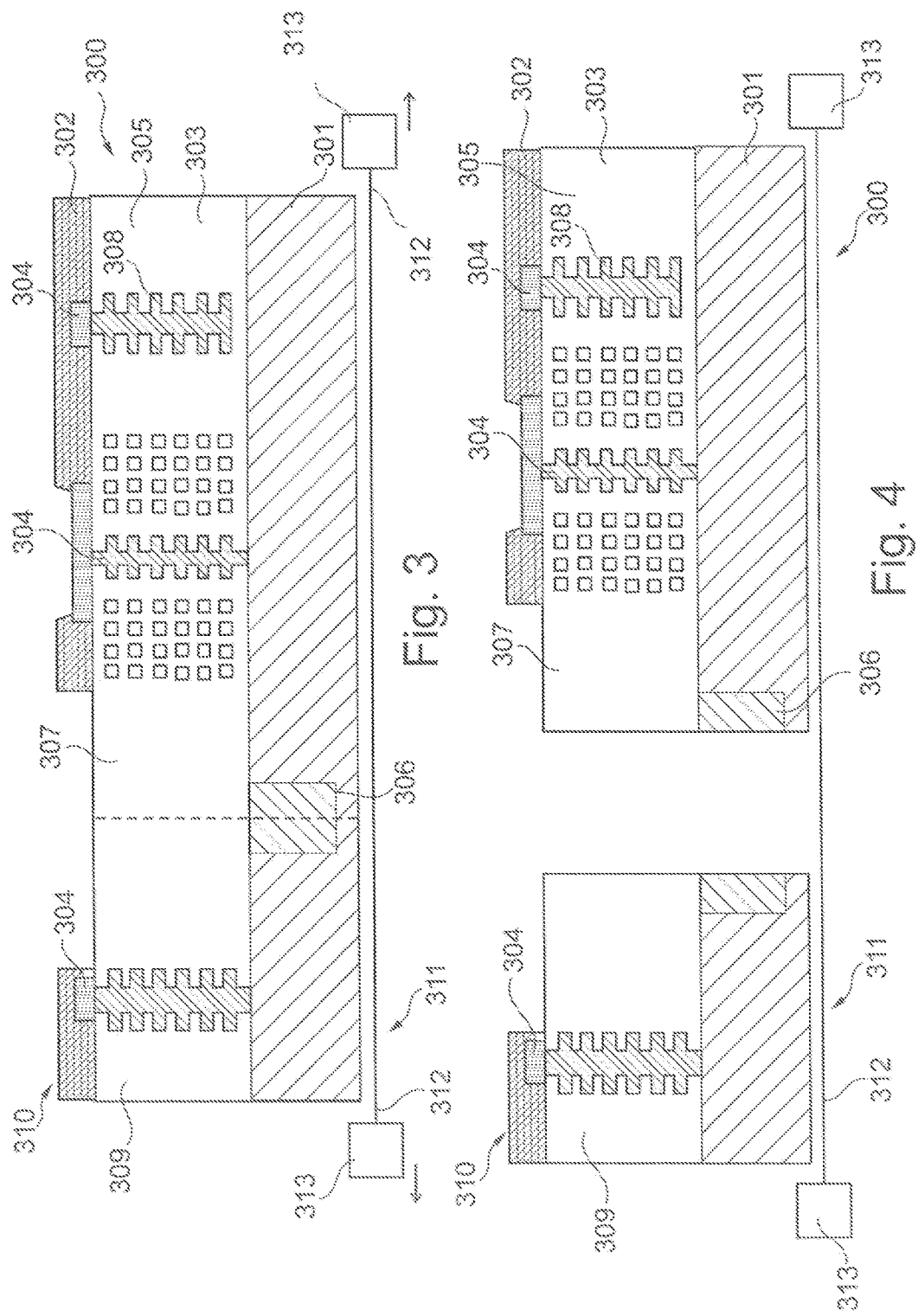

SEMICONDUCTOR WAFER AND METHOD OF PRODUCING THE SAME

CROSS-REFERENCE TO RELATED APPLICATIONS

This application claims the priority under 35 U.S.C. §119 of European patent application no. 11168688.7, filed on Jun. 3, 2011, the contents of which are incorporated by reference herein.

FIELD OF THE INVENTION

The invention relates to a semiconductor wafer having a regular pattern of predetermined separation lanes, in particular to a semiconductor wafer which can be used for creation of ultrathin and ultrarobust silicon chips.

Beyond this, the invention relates to a method of producing a wafer having a regular pattern of predetermined separation lanes.

BACKGROUND OF THE INVENTION

In the field of ultrathin integrated circuit or semiconductor wafers, the separation of such ultrathin integrated circuit wafers may result in back side and front side chipping. In particular, a mechanical robustness and flexibility of a die may be reduced due to the low thickness of the wafers. Back end of line layers of advanced semiconductor device wafers, e.g. of advanced CMOS devices, are covered with metals, e.g. copper, dielectric materials, e.g. low k materials, and other materials like silicon nitride as a passivation material and/or aluminum for chip finishing, and/or bond pads. The design rules for advanced semiconductor device wafers require a dense coverage of metal (e.g. copper, aluminum, etc) tiles in order to fulfill homogeneity and planarization demands. The ubiquitous metal coverage dominates the mechanical behavior of the semiconductor wafer and/or chip when a thickness of a substrate, e.g. silicon, reduced to a thickness smaller than 150 micrometers. The semiconductor wafer and/or chip behave like composite of a flexible silicon spring with a ductile metal multi layer on top of it. For ultrathin semiconductor wafers, in particular, when a thickness of the metal/dielectrical layers approaches a thickness of a remaining silicon substrate, a mechanical blade dicing process may not reach a high process capability. The reason may be a strong clogging or strong coverage of the dicing blade with metal, e.g. copper.

Alternative laser separation or even dry (trench) etching processes that could overcome the issue of mechanical chip weakness may not be applied on the wafer front side, because the metal structures may shield laser separation or even dry (trench) etching processes.

OBJECT AND SUMMARY OF THE INVENTION

There may be a need to provide a semiconductor wafer having a regular pattern of predetermined separation lanes, and method of producing a wafer having a regular pattern of predetermined separation lanes that allow for an easy separation of a semiconductor wafer while at the same time maintaining a mechanical robustness and flexibility of a separated die.

In order to meet the need defined above, a method and a device according to the independent claims are provided. Further embodiments are described in the dependent claims.

According to an exemplary aspect, a semiconductor wafer having a regular pattern of predetermined separation lanes, wherein the predetermined separation lanes are configured in such a way that the semiconductor wafer is singularizable along the regular pattern.

In particular, the predetermined separation lanes may have a predetermined width which is adapted in such a way that it enables the singularization or dicing but at the same time is narrow enough that an area density across the wafer is of suitable homogeneity that the processing of the wafer can be performed, in particular without restriction. In particular, the predetermined separation lane may adjoin or may be arranged adjacent to a standard saw lane which may have test structures and/or mask alignment structures (e.g. wafer release modules (PCM), mask alignment and special processing structures (OCM/T-Boxes). A semiconductor wafer may be in particular a raw substrate, e.g. a silicon substrate, a partly processed, or a fully processed semiconductor wafer already comprising chips and/or integrated circuits and/or semiconductor devices. In particular, the regular pattern of predetermined separation lanes may be formed by unpatterned or unprocessed lanes, e.g. lanes which may be metal free and/or polycrystalline silicon free, and/or trenches between partly or fully processed chips or dies.

The term "unpatterned lanes" may particularly denote lanes or areas on the wafer without semiconductor devices or chips or integrated circuits or parts thereof. In other words, the predetermined separation lines may form a regular pattern of areas which are free of metal or polycrystalline silicon forming parts of semiconductor devices. The unpatterned lanes or areas may be formed either by sparing these lanes from deposition of metal or components with metal-like characteristics during the processing of the wafer or substrate or by removing substantially all deposited metal or polycrystalline silicon layers during the processing of the wafer or substrate. More particularly, the unpatterned lanes may be formed by areas which may not comprise any metal components and/or components with metal-like characteristics, e.g. polycrystalline silicone. In this context "free of metal or metal free" may particularly denote areas in which substantially no metal or conductor lanes, e.g. polycrystalline silicone lanes, are formed. However, small amounts of metal and/or polycrystalline silicon may be present in the metal free lanes.

In particular, the predetermined separation lanes may form areas which may allow for easy separating or singularizing the processed semiconductor wafer into individual chips. For example, the dies of the processed semiconductor wafer may be singularized by cutting and/or laser dicing and/or etching and/or breaking. In particular, a final passivation layer, e.g. silicon nitride, may be removed in the area of the predetermined separation lane. In particular, a delamination on the front side of the semiconductor wafer may be avoided during die separation due to the providing of predetermined separation lanes having a suitable width, for example.

According to a further exemplary aspect, a method of producing a wafer having a regular pattern of predetermined separation lanes is provided. The method comprises providing an unpatterned or unprocessed semiconductor wafer, leaving a regular pattern of unpatterned lanes between chip areas during the further processing of the semiconductor wafer, from a wafer front side and/or back side, and/or forming regular pattern of predetermined separation lanes by implanting ions between chip areas during the processing of the unpatterned or unprocessed semiconductor wafer.

In particular, the unpatterned lanes may be formed by areas on which no processing, structuring or patterning took place during the forming of the integrated circuits of the chips.

The term "chip areas" or "functional chip areas" may denote areas or portion of a semiconductor wafer on which semiconductor devices or integrated circuits or chips or active elements or parts thereof are formed.

In particular, the regular pattern of predetermined separation lanes may be formed by deep oxygen implantation from a wafer front side and/or a wafer back side. In particular the ion implantation may take place prior the processing of the semiconductor wafer, i.e. before electronic or integrated circuits of a chip are formed, intermittently or subsequently to the processing of the semiconductor wafer. In particular, an implantation depth and/or implantation direction may be adjusted to a thickness of a final semiconductor wafer.

The provision of semiconductor wafers already having a pattern of predetermined separation lanes formed thereon may in particular enable to avoid a delamination on a front side of the semiconductor wafer, in particular on a chip, due to imperfect die separation. In particular, a delamination of metal layers and/or polycrystalline silicon layers or an incomplete separation due to ductile metal fillings may not occur. Also, a chipping on a back side of the semiconductor wafer, in particular in case of thin semiconductor wafers, e.g. smaller than 150 micrometers, may be avoidable, which may result in a significant improvement of mechanical chip strength. Moreover, delamination of brittle and low adhesion dielectric materials, e.g. low k materials, even into an active chip area beyond a chip seal ring may be avoidable. Furthermore, a semiconductor wafer having a pattern of predetermined separation lanes formed thereon may in particular allow for a manufacturing of chips with defect free chip edges. A risk of mechanical damages that may propagate to functional chip areas may be reduced. Moreover, a risk of mechanical breakage of a chip in assembly and/or field application may be reduced. In case of ion implantation from a wafer front side the provision of semiconductor wafers having a pattern of predetermined separation lanes formed thereon may not require major changes in front end product design since a layout may be fully implementable into a default product mask set. For example, test patterns, e.g. OCM and/or PCM, may still be used as in state of the art wafers with default saw lane layout or reticle drop-in. In addition, in the case of small sized chips subsequent laser dicing and/or blade dicing processes may be skipped. Furthermore, the die separation may be less depending on overall thickness to thickness variations of the semiconductor wafer.

In the following, further exemplary embodiments of the semiconductor wafer will be explained. However, these embodiments also apply to the method of producing a wafer.

According to another exemplary embodiment, a semiconductor wafer is provided, wherein the predetermined separation lanes have a width between 1 micrometer and 50 micrometer.

The width of the predetermined separation lanes may in particular be between 1 micrometer and 50 micrometer or smaller than 50 micrometer, more particularly between 5 micrometer and 25 micrometer.

According to another exemplary embodiment a semiconductor wafer is provided, wherein the regular pattern of predetermined separation lanes is a rectangular pattern of predetermined separation lanes.

In particular, the rectangular pattern of predetermined separation lanes may be formed by lanes between rectangular shaped dies which may be comprised in or may form the semiconductor wafer.

According to another exemplary embodiment a semiconductor wafer is provided, wherein the predetermined separation lanes are formed by implantation of ions into the semiconductor wafer.

In particular, the implantation of ions may take place prior the processing of the semiconductor wafer, i.e. before electronic or integrated circuits of a chip are formed, or intermittently or subsequently to the processing of the semiconductor wafer. In particular, an implantation depth may be adjusted to a thickness of a final semiconductor wafer.

According to another exemplary embodiment a semiconductor wafer is provided, wherein the predetermined separation lanes are formed by implantation of ions into the semiconductor wafer, wherein the implanted ions are oxygen ions.

More particularly, the predetermined separation lanes may be formed by deep oxygen implantation. In particular, a mask patterned oxide layer may induce a defined stress layer in the predetermined separation lane. For example, when using a silicon substrate, the implanted oxygen ions may form vertical lanes, areas, or portions of silicon oxide within the silicon substrate of the semiconductor wafer. In particular, the vertical silicon oxide lanes of predetermined separation lanes may allow for separating the semiconductor wafer along the predetermined separation lanes by expansion of the semiconductor wafer since the vertical silicon oxide lanes form lanes of weakened spots or weakened areas that may allow for easy breaking of the semiconductor wafer. More particularly, the deep oxygen ion implantation may exactly define a location and a plane where the silicon lattice may fracture.

According to another exemplary embodiment a semiconductor wafer is provided, wherein the predetermined separation lanes are formed by metal free lanes and/or polycrystalline silicon free lanes between chip areas.

In particular, the metal free and/or polycrystalline silicon free lanes may be in accordance with back-end-of-line design rules based on dual damascene process technology.

The regular pattern of predetermined separation lanes formed by metal free and/or polycrystalline silicon free lanes may allow avoiding a clogging of dicing blades with metal components during a chip separation, in particular die separation by cutting. This may have the advantage that a back side chipping may be avoidable. In particular, the metal free and/or polycrystalline silicon free lanes of the regular pattern of predetermined separation lanes may allow for easy laser dicing on a front side and/or back side of the wafer along the predetermined separation lanes, since the predetermined separation lanes may not comprise any components that will substantially reduce an efficiency of a laser beam during a laser dicing process.

According to another exemplary embodiment the method may comprise singularizing or dicing the chips produced on the semiconductor wafer by etching.

In particular, the etching may be wet chemical etching and/or a dry etching on a front side and/or back side of the semiconductor wafer. An etching process may in particular be suitable to separate chips formed on the wafer in case the predetermined separation lanes are formed by implanting ions, e.g. oxygen ions. For example, the etching agent may have a high etch selectivity between silicon and silicon oxide so that the chips may be separable along lanes of silicon oxide within the semiconductor wafer. In particular, an etching agent may be diluted HF.

According to another exemplary embodiment the method may comprise singularizing or dicing the chips produced on the semiconductor wafer by expansion.

In particular, the expansion may be implemented by applying a sticky tape, e.g. an adhesive tape, on the back side of the semiconductor wafer, placing the sticky tape with the semiconductor wafer thereon into a supporting frame, e.g. a film frame carrier, and stretching the sticky tape with aid of the supporting frame in an outward direction. This causes the sticky tape to expand and with it expands the semiconductor wafer. An expansion process may in particular be suitable to separate chips formed on the wafer in case the predetermined separation lanes are formed by implanting ions, e.g. oxygen ions.

In another exemplary embodiment the predetermined separation lanes are predetermined weak lanes produced by implantation of ions and/or etching, the method may further comprise singularizing the chips produced on the semiconductor wafer by expansion and subsequent breakage along predetermined weak lanes.

For example, silicon oxide lanes may form weakened lanes or weakened areas in the crystal structure of a silicon so that the chips may be separable along lanes of silicon oxide within the semiconductor wafer. In particular, a breakage mechanism may be build-in compressive stress which may be off-loaded during expansion of the semiconductor wafer, in particular a thinned semiconductor wafer.

In another exemplary embodiment the method may further comprise singularizing or dicing the chips produced on the semiconductor wafer by cutting.

In particular, the cutting may be performed on a back side of the semiconductor wafer. A cutting process may in particular be suitable to separate chips formed on the wafer in case the predetermined separation lanes are formed by unpatterned lanes.

According to another exemplary embodiment the method may further comprise singularizing or dicing the chips produced on the semiconductor wafer by laser separation.

In particular, the laser separation may be performed by using a laser beam on a back side or on a front side of the semiconductor wafer. A laser separation process may in particular be suitable to separate chips formed on the wafer in case the predetermined separation lanes are formed by unpatterned lanes. Due to the fact that the predetermined separation lanes may be formed by metal free and/or polycrystalline silicon free lanes laser separation may be performable also on the front side of the semiconductor wafer because the separation process may no longer be shielded by metal structures. In particular, due to the predetermined separation lanes, a laser separation or laser dicing processes may not damage the crystal lattice close to the die edge. Thereby mechanical die robustness may be maintained. Moreover, the predetermined separation lanes may reduce a dependence of the laser dicing process on the wafer thickness, in particular a negative effect of wafer thickness variations on a separation process may be reduced. In the case of a semiconductor wafer with a silicon substrate thickness lower than 20 micrometer, predetermined separation lanes may prevent imperfect die edges during laser separation. Imperfect die edges may lead to fragile chips. Furthermore, additional alignment markers may not be required in the case of front side laser separation or laser dicing. A further aspect when using a method according to an exemplary embodiment may be the enabling of easier die separation in case of wafer back side coating (WBC) required for standard package applications.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

FIG. 3 schematically illustrates a semiconductor wafer prior to a separation by expansion.

FIG. 4 schematically illustrates a semiconductor wafer after a separation by expansion.

DESCRIPTION OF EMBODIMENTS

Figure 1:
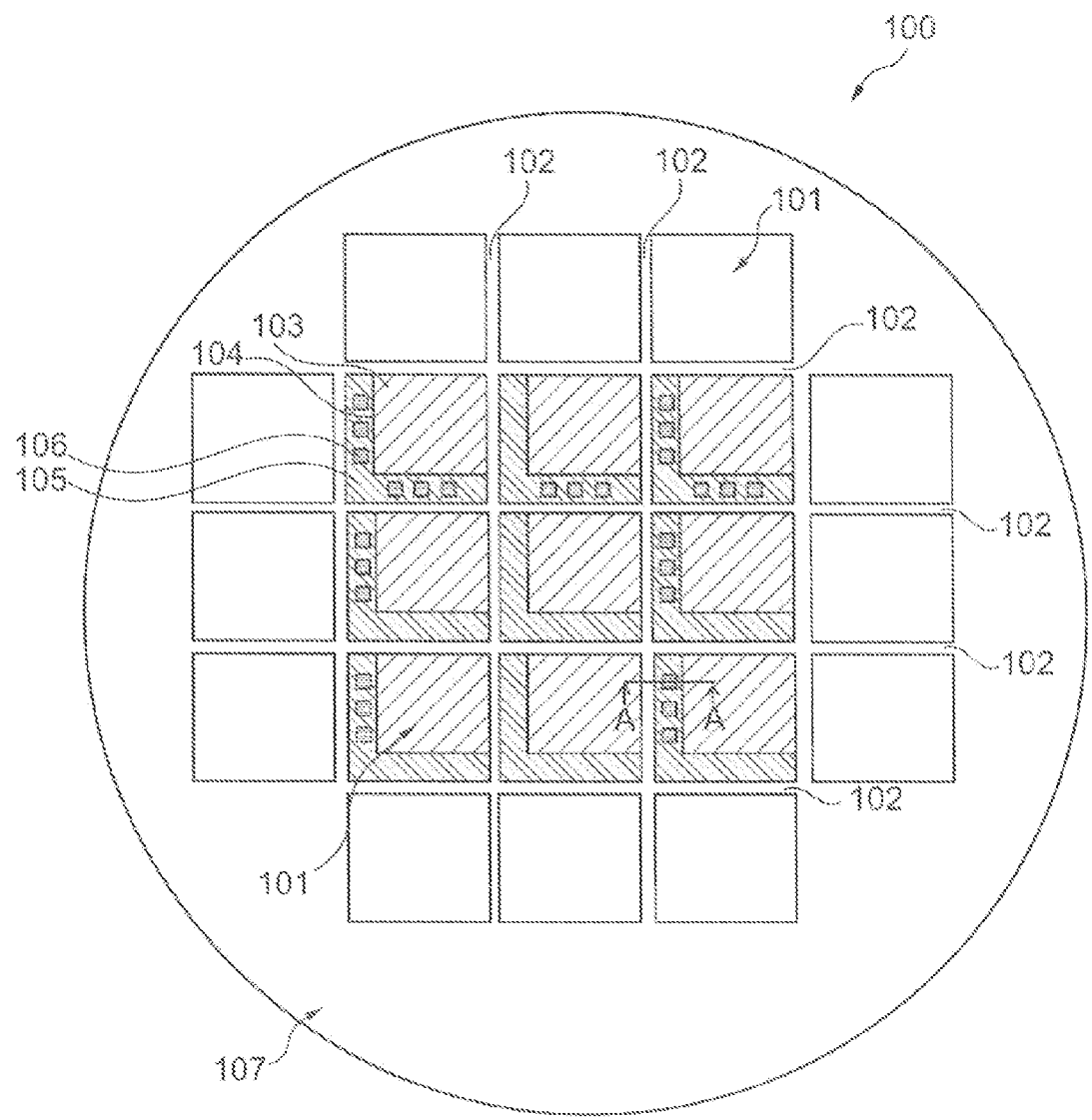
FIG. 1 schematically illustrates a semiconductor wafer according to an exemplary embodiment.

The illustration in the drawing is schematically. In different drawings, similar or identical elements are provided with the same reference signs.

FIG. 1 schematically illustrates a semiconductor wafer 100 having a silicon substrate. The wafer comprises a number of chips 101 arranged in an array on a front side 107 of the semiconductor wafer. Metal free and/or polycrystalline silicon free lanes 102 are arranged between the individual chips 101. A width of the metal free and/or polycrystalline silicon free lanes 102 may be between 1 micrometer and 50 micrometer or less than 50 micrometer. In an exemplary embodiment the width of the metal free and/or polycrystalline silicon free lanes 102 may be 20 micrometer. Each chip 101 comprises an active area 103, whose border is formed by a seal ring 104. The area 103 may comprise semiconductor devices such as integrated circuits and/or active elements. Adjacent to the seal ring 104 each chip 101 comprises an area 105, which is covered with metal tiles and/or polycrystalline silicon tiles and comprises test structures 106. A width of the area 105 is between 15 micrometers and 150 micrometer. In an exemplary embodiment the width of area 105 may be 60 micrometers.

Figure 2:
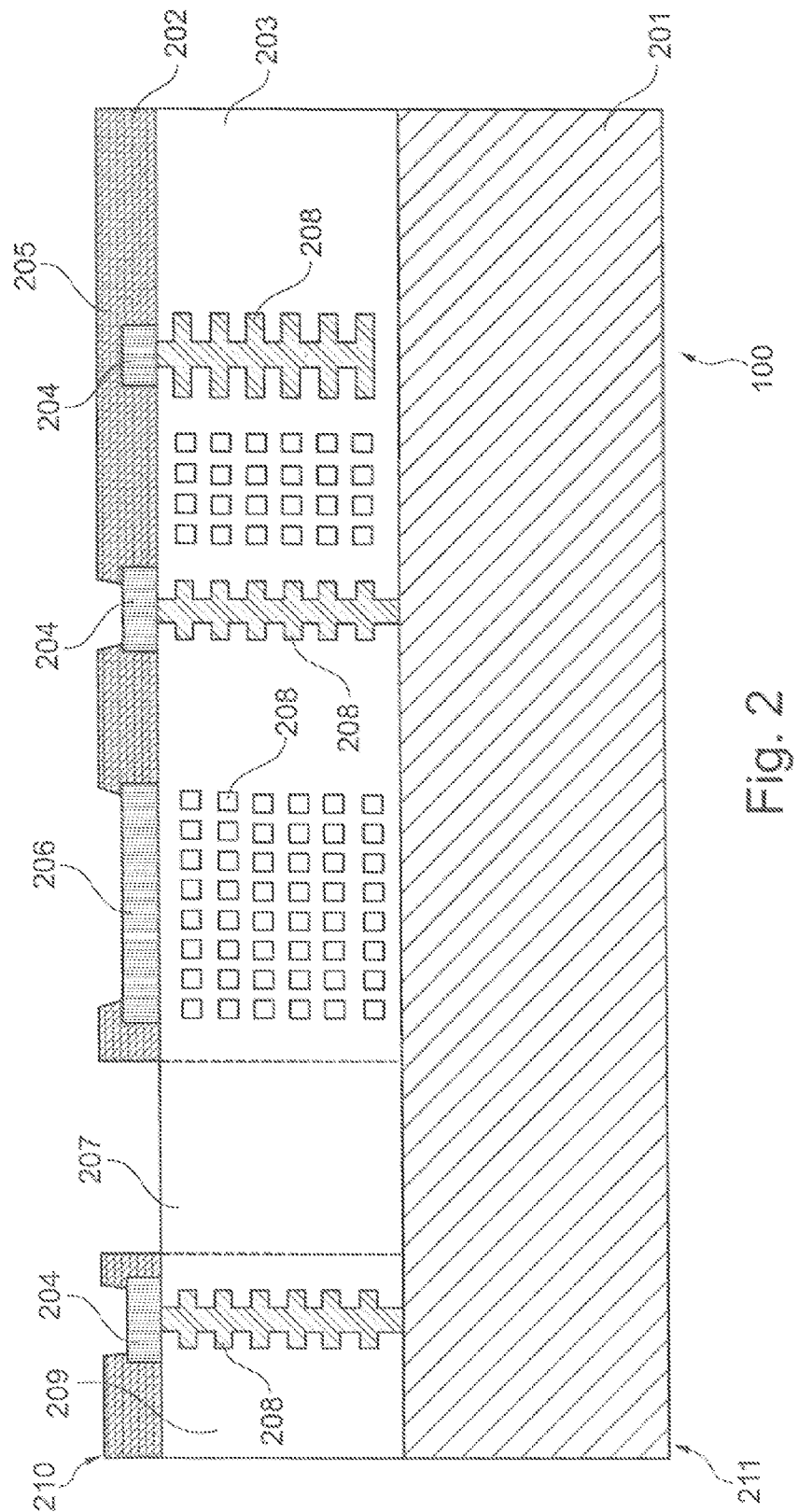
FIG. 2 schematically illustrates a cross section through the semiconductor wafer illustrated in FIG. 1 along the line A-A.

FIG. 2 schematically illustrates a cross section through the semiconductor wafer 100 illustrated in FIG. 1 along the line A-A. The semiconductor wafer 100 comprises a silicone substrate 201 and a final passivation layer of silicon nitride 202 on top of the semiconductor wafer. The cross section shown in FIG. 2 further shows an area 205 with active elements, whose border is formed by a seal ring 204. On top of the seal ring the passivation layer may be open or alternatively the passivation layer may cover the seal ring as well. The alternatives may be chosen depending on different process options or silicon foundries. Adjacent to the seal ring 204 a test structure 206 is shown. The area 205 as well as the seal ring 204 and the test structure 206 comprise metal layers and/or polycrystalline silicon layers 208 and dielectric material layers 203. Between the test structure 206 and the seal ring 204 of another active area 209 the semiconductor wafer 100 comprises a metal free and/or polycrystalline silicon free lane or portion 207 which consist only or substantially only of dielectric materials. The final passivation silicon nitride layer 202 may be removed in the area of the metal free and/or polycrystalline silicon free lane 207. This metal free and/or polycrystalline silicon free lane 207 may in particular be suited to separate the active areas 205 and 209 formed on the semiconductor wafer 100 from each other by laser separation. Due to the fact that the metal free and/or polycrystalline silicon free lane 207 does neither comprise metal and/or polycrystalline silicon on a front side 210 of the semiconductor wafer 100 nor on a back side 211 of the semiconductor wafer 100 the laser separation may be performable on the front side 210 of the semiconductor wafer 100 as well as on the back side 211 of the semiconductor wafer 100.

FIG. 3 schematically illustrates a semiconductor wafer 300 prior to a separation by expansion. The semiconductor wafer 300 comprises a final passivation layer of silicon nitride 302 on top of the semiconductor wafer. The cross section showed in FIG. 3 further shows an active area 305 the border of which is formed by a seal ring 304. The active area 305 as well as the seal ring 304 comprises metal layers and/or polycrystalline silicon layers 308 and dielectric material layers 303. Between the seal ring 304 of the active area 305 and the seal ring 304 of another area 309 the semiconductor wafer 300 comprises a metal free and/or polycrystalline silicon free lane 307 which consist only of dielectric materials, in particular the final passivation silicon nitride layer 302 may be removed in the area of the metal free and/or polycrystalline silicon free lane 307. Furthermore, the metal free and/or polycrystalline silicon free lane 307 comprises a lane of silicon oxide 306 within the silicon substrate 301. The lane of silicon oxide 306 is formed by implanting oxygen ions into the silicon substrate 301 prior and/or subsequent to a processing of the semiconductor wafer 300. The oxygen ions may be implanted across the whole thickness of the silicon substrate 301 or only across parts thereof. Consequently the depth of the silicon oxide lane 306 may either extend along a part of the thickness of a silicon substrate 301 or along the entire thickness of the silicon substrate 301. For a separation of the semiconductor wafer 300 into individual chips, a sticky tape 312 is applied to a back side 311 of the semiconductor wafer 300. Alternatively, the sticky tape may also be appliable to a front side 310 of the semiconductor wafer 300. The sticky tape 312 is mounted in a film frame carrier 313. In order to separate the individual chips of the semiconductor wafer 300, the sticky tape 312 is expanded, in particular isotropically extended or expanded, in an outward direction by the aid of the film frame carrier 313 as indicated by the arrows in FIG. 3. This causes the semiconductor wafer 300 to separate along the lanes of silicon oxide 306. The result of such a separation is illustrated in FIG. 4.

FIG. 4 schematically illustrates the semiconductor wafer 300 after a separation by expansion. Since the lane of silicon oxide 306 within the semiconductor wafer 300 forms a weakened lane in the silicon crystal structure, the semiconductor wafer 300 is separated along the metal free and/or polycrystalline silicon free lane 307 having below the weakened lane of silicon oxide.

Figure 5:
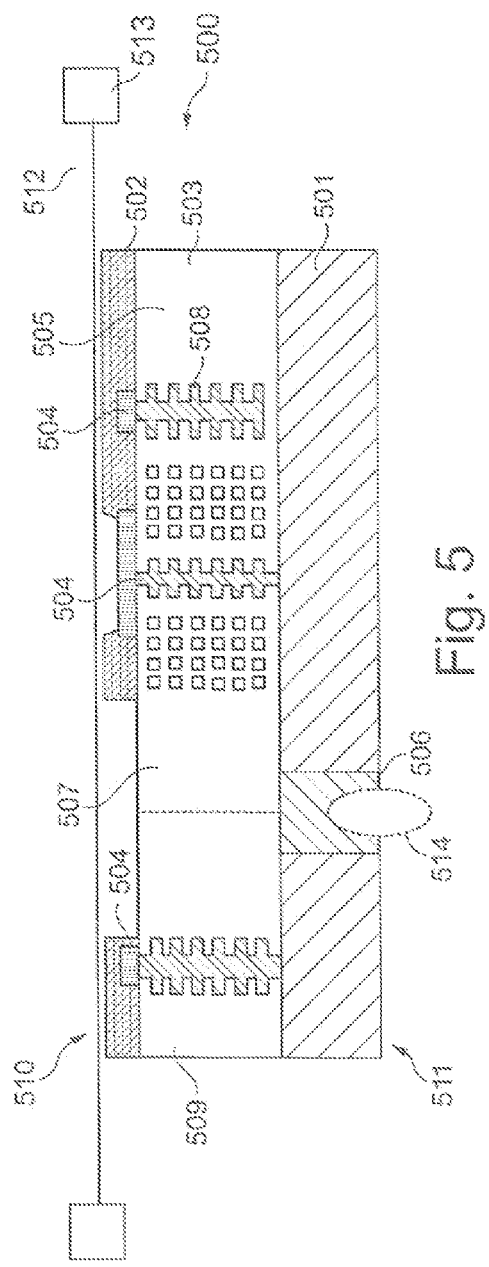
FIG. 5 schematically illustrates a semiconductor wafer after etching and prior to a separation by expansion.

FIG. 5 schematically illustrates a semiconductor wafer 500 after etching and prior to a separation by expansion. The semiconductor wafer 500 comprises a final passivation layer of silicon nitride 502 on top of the semiconductor wafer formed on a silicon substrate 501. The cross section shown in FIG. 5 further shows an area 505 the border of which is formed by a seal ring 504. The area 505 as well as the seal ring 504 comprises metal layers and/or polycrystalline silicon layers 508 and dielectric material layers 503. Between the seal ring 504 of the area 505 and the seal ring 504 of another area 509 the semiconductor wafer 500 comprises a metal free and/or polycrystalline silicon free lane 507 which consist only of dielectric materials, in particular the final passivation silicon nitride layer 502 may be in the area of the metal free and/or polycrystalline silicon free lane 507. Furthermore, the metal free and/or polycrystalline silicon free lane 507 comprises a lane of silicon oxide 506 within the silicon substrate 501. The lane of silicon oxide 506 is formed by implanting oxygen ions into the silicon substrate 501 prior to a processing of the semiconductor wafer 500. Prior to the separation an etching agent, e.g. HF, is applied to a back end side 511 of the semiconductor wafer 500. The etching agent etches with a high etch selectivity between silicon and silicon oxide so that mainly the silicon oxide in the lane of silicon oxide 506 is removed by the etching agent. This etching process leaves a trench 514 in the back end side 511 of the semiconductor wafer 500. For a separation of the semiconductor wafer 500 into individual chips, a sticky tape 512 is applied to a front side 510 of the semiconductor wafer 500. The sticky tape 512 is mounted in a film frame carrier 513 which is then expanded.

Figure 6:
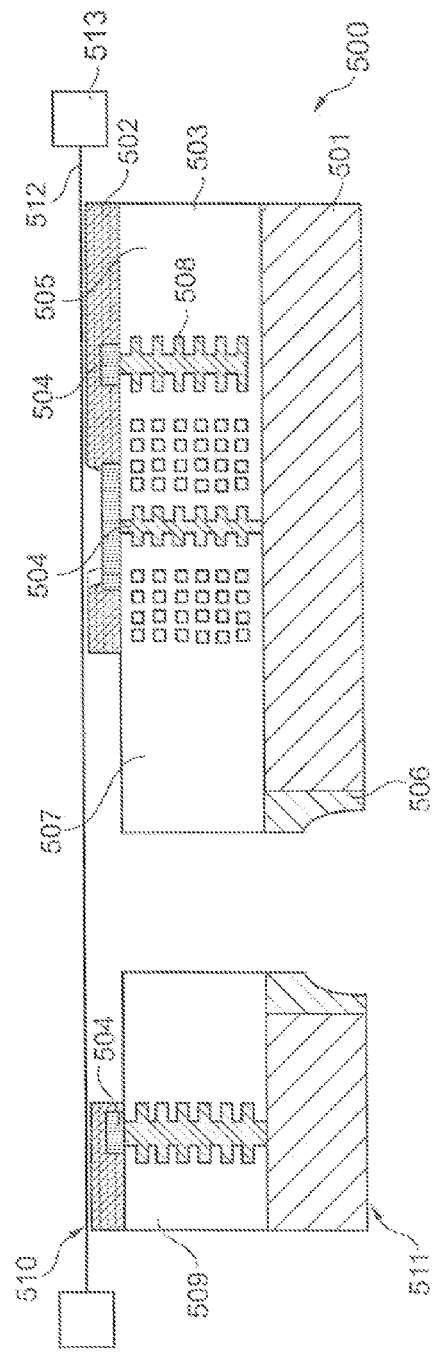
FIG. 6 schematically illustrates a semiconductor wafer after etching and after a separation by expansion.

FIG. 6 schematically illustrates the semiconductor wafer 500 after etching and after a separation by expansion. The semiconductor wafer 500 is separated by expanding, in particular isotropically expanding, the sticky tape 512 in an outward direction by the aid of the film frame carrier 513. This causes the semiconductor wafer 500 to separate along the trench 514.

It should be noted that the term "comprising" does not exclude other elements or features and the "a" or "an" does not exclude a plurality. Also elements described in association with different embodiments may be combined.

It should also be noted that reference signs in the claims shall not be construed as limiting the scope of the claims.

The invention claimed is:

1. A semiconductor wafer comprising:
a substrate; and
a metal or polycrystalline silicon layer and a regular pattern of separation lanes including a dielectric material on a front side of the substrate,
wherein the separation lanes further include ions implanted into portions of the substrate, the ions extending through the substrate from a back side of the semiconductor wafer to the dielectric material and terminating at the dielectric material, to define a weakened portion of the substrate in the separation lanes, the weakened portion being configured to facilitate singulation along the regular pattern and to prevent imperfect die edges during laser separation, and
wherein the separation lanes are lanes between chip areas and the separation lanes are substantially free, on both the back side and the front side of the wafer, of metal or polycrystalline silicon throughout the dielectric material on the substrate.

2. The semiconductor wafer as claimed in claim 1, wherein the separation lanes have a width between 1 micrometer and 50 micrometers and extend contiguously from the front side to the back side of the semiconductor wafer, through the dielectric material on the substrate and the portions of the substrate with implanted ions, the dielectric material in the separation lanes being stacked on the weakened portions of the substrate.

3. The semiconductor wafer as claimed in claim 1,
wherein the portions of the substrate in which the ions are implanted include silicon oxide having silicon from the substrate and oxygen from the ions, and
each separation lane further including an etched recess extending into the silicon oxide from the back side, the etched recess being configured and arranged to further weaken the separation lane and therein facilitate initiation of singulation of the semiconductor wafer in the separation lane.

4. The semiconductor wafer as claimed in claim 1, wherein the substrate is formed of silicon and is less than 20 micrometers thick.

5. A method of producing a wafer having chip areas including a layer containing metal or polycrystalline silicon and a regular pattern of separation lanes between the chip areas, the method comprising:
providing an unpatterned semiconductor wafer including a substrate and a dielectric material on a front side of the substrate, and
forming regular pattern of separation lanes by implanting ions via a back side of the wafer into silicon material of the substrate under the dielectric material and along lanes that extend between the chip areas of the semiconductor wafer to define, weaken and configure the separation lanes to singularize along the regular pattern and to prevent imperfect die edges during laser separation, the ions extending from a back side of the substrate to the dielectric material,
wherein the separation lanes are substantially free of the metal or polycrystalline silicon throughout the dielectric material on the substrate.

6. The method as claimed in claim 5, wherein implanting the ions into the silicon material includes implanting oxygen ions into the silicon material of the substrate to form vertical lanes of silicon oxide in the substrate with portions of the dielectric material stacked on the silicon oxide and extending between the chip areas, the method further comprising:
singularizing the chips produced on the semiconductor wafer by, applying a chemical etching agent on the back side of the wafer, the chemical etching agent being selective to silicon oxide, and using the chemical etching agent to selectively etch trenches extending from the back side into the silicon oxide of the separation lanes, wherein the singularized chips produced have die edges processed to mitigate delamination, incomplete separation and chipping.

7. The method as claimed in claim 6, wherein the separation lanes are weak lanes produced by implantation of ions, the method further comprising:
singularizing the chips produced on the semiconductor wafer by expansion and subsequent breakage along the weak lanes and the trench.

8. The method as claimed in claim 5, the method further comprising:
applying lateral forces, relevant to the semiconductor wafer, to singularize the chips produced on the semiconductor wafer by expansion.

9. The method as claimed in claim 5, the method further comprising:
singularizing the chips produced on the semiconductor wafer by cutting.

10. The method as claimed in claim 5, the method further comprising:
singularizing the chips produced on the semiconductor wafer by laser separation on a the front side of the semiconductor wafer.

11. The method as claimed in claim 5, wherein the ion implantation takes place prior to a processing of the semiconductor wafer
or
during the processing of the semiconductor wafer.

12. The method as claimed in claim 5, the method further comprising:
leaving a regular pattern of unpatterned lanes between the chip areas during a further processing of the semiconductor wafer.

13. The method as claimed in claim 7, the method further comprising:
forming the separation lanes by sparing the silicon material in the separation lanes from deposition of the metal or polycrystalline silicon during processing of the semiconductor wafer.

14. The method claimed in claim 5, the method further comprising:
applying lateral forces relevant to the semiconductor wafer, to singularize the chips produced on the semiconductor wafer by expansion and without performing a laser separation process.

15. The method as claimed in claim 5, the method further comprising:
forming the separation lanes by removing the metal or polycrystalline silicon within the lanes during prior processing of the semiconductor wafer.

16. An apparatus comprising:
a semiconductor wafer including a silicon substrate and chip areas including metal or polycrystalline silicon separated by a regular pattern of separation lanes including a dielectric material on a front side of the silicon substrate, wherein the separation lanes are substantially free of the metal or polycrystalline silicon throughout the dielectric material on the silicon substrate,
wherein the separation lanes include ions implanted into portions of the silicon substrate of the semiconductor wafer to define the separation lanes, extending between the chip areas from a back side of the silicon substrate and terminating at the dielectric material, the ions being configured and arranged to weaken the silicon substrate along the separation lanes to facilitate singularizing of the wafer along the regular pattern and to prevent imperfect die edges during laser separation, and
a supporting frame configured and arranged to expand the semiconductor wafer sufficient to separate chips along the regular pattern of the separation lanes.

17. The apparatus of claim 16, wherein the supporting frame is configured and arranged to apply a lateral force to the semiconductor wafer to expand the semiconductor wafer.

18. The apparatus of claim 16, further including a lateral support means for attaching to the semiconductor wafer and stretching, with aid of the supporting frame, in a lateral direction to expand the semiconductor wafer.

19. The apparatus of claim 16, wherein the separation lanes include the dielectric material on the substrate stacked on the weakened portions of the silicon substrate, the dielectric material and the weakened portions extending contiguously from a back side to a front side of the semiconductor wafer and through the dielectric material between the metal or polycrystalline silicon.

* * * * *